(12) United States Patent
Song et al.

(10) Patent No.: US 8,987,860 B2
(45) Date of Patent: Mar. 24, 2015

(54) SEMICONDUCTOR DEVICE

(71) Applicant: Samsung Electronics Co., Ltd., Suwon-si, Gyeonggi-do (KR)

(72) Inventors: Bo-young Song, Seongnam-si (KR); Cheol-ju Yun, Suwon-si (KR); Seung-hee Ko, Seogwipo-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/103,195

(22) Filed: Dec. 11, 2013

(65) Prior Publication Data
US 2014/0159194 A1   Jun. 12, 2014

(30) Foreign Application Priority Data
Dec. 10, 2012   (KR) .................. 10-2012-0142903

(51) Int. Cl.
*H01L 29/06*   (2006.01)
*H01L 21/764*   (2006.01)
*H01L 49/02*   (2006.01)
*H01L 27/108*   (2006.01)

(52) U.S. Cl.
CPC .......... *H01L 29/0649* (2013.01); *H01L 21/764* (2013.01); *H01L 28/90* (2013.01); *H01L 27/10888* (2013.01); *H01L 27/10811* (2013.01); *H01L 27/10855* (2013.01)
USPC .... 257/522; 257/506; 257/499; 257/E27.088; 438/421; 438/411

(58) Field of Classification Search
CPC ............. H01L 21/764; H01L 21/7682; H01L 27/10855; H01L 27/10888; H01L 27/10811; H01L 28/90; H01L 29/0649
USPC .......... 257/316, E21.658, E27.087, E21.018, 257/E21.573, 522, 506, 499, E27.088; 438/421

See application file for complete search history.

(56) References Cited

U.S. PATENT DOCUMENTS

| | | | |
|---|---|---|---|
| 6,483,140 B1 * | 11/2002 | Matsuoka et al. | 257/303 |
| 6,495,900 B1 | 12/2002 | Mouli et al. | |
| 6,501,120 B1 * | 12/2002 | Tu et al. | 257/306 |
| 6,720,601 B2 | 4/2004 | Terauchi et al. | |
| 7,091,567 B2 | 8/2006 | Park et al. | |
| 7,132,342 B1 | 11/2006 | Sadovnikov et al. | |
| 7,858,473 B2 | 12/2010 | Park et al. | |
| 7,994,040 B2 | 8/2011 | Chi et al. | |
| 2006/0073695 A1 * | 4/2006 | Filippi et al. | 438/619 |
| 2008/0096364 A1 | 4/2008 | Wilson et al. | |
| 2011/0037111 A1 * | 2/2011 | Kim et al. | 257/302 |

(Continued)

FOREIGN PATENT DOCUMENTS

KR   10-2004-0008612 A   1/2004

*Primary Examiner* — Jerome Jackson, Jr.
*Assistant Examiner* — Nilufa Rahim
(74) *Attorney, Agent, or Firm* — Lee & Morse, P.C.

(57) ABSTRACT

A semiconductor device includes a substrate having a plurality of active regions defined by a device isolation region, a plurality of conductive patterns on the plurality of active regions, each of the conductive patterns having side walls, a conductive line that faces the side walls of the conductive patterns with an air spacer therebetween on the active regions, the conductive line extending in a first direction, and a first insulating film covering the side walls of the conductive patterns between the air spacer and the conductive pattern. A lower portion of the first insulating film that is near the substrate protrudes toward the air spacer.

20 Claims, 16 Drawing Sheets

(56) References Cited

U.S. PATENT DOCUMENTS

| | | |
|---|---|---|
| 2011/0140191 A1 | 6/2011 | Fumitake |
| 2012/0007165 A1* | 1/2012 | Lee et al. ............. 257/316 |
| 2012/0074484 A1* | 3/2012 | Kang et al. ............. 257/316 |
| 2012/0104466 A1 | 5/2012 | Zhu et al. |
| 2012/0276711 A1* | 11/2012 | Yoon et al. ............. 438/421 |
| 2012/0280313 A1* | 11/2012 | Shin et al. ............. 257/330 |
| 2013/0292847 A1* | 11/2013 | Choi et al. ............. 257/774 |
| 2014/0120692 A1* | 5/2014 | Purayath et al. ............. 438/421 |

\* cited by examiner

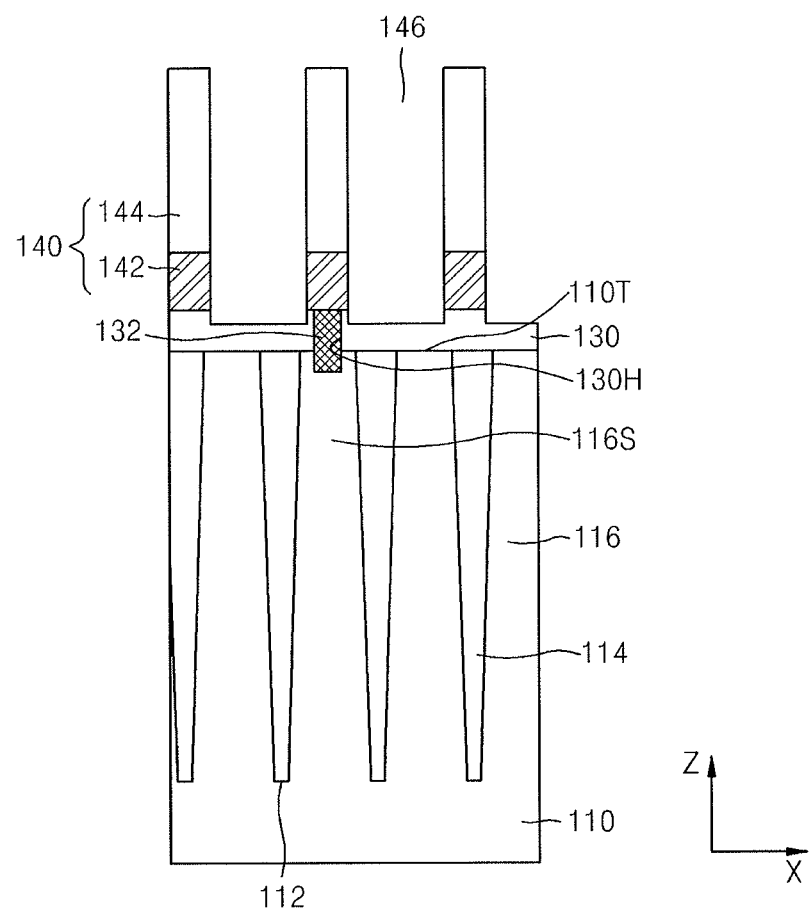

SEMICONDUCTOR DEVICE

CROSS-REFERENCE TO RELATED APPLICATION

Korean Patent Application No. 10-2012-0142903, filed on Dec. 10, 2012, in the Korean Intellectual Property Office, and entitled: "Semiconductor Device," is incorporated by reference herein in its entirety.

BACKGROUND

1. Field

Embodiments relate to a semiconductor device, and in particular, to a semiconductor device including a plurality of conductive patterns.

2. Description of the Related Art

The substantial development of the electronic industry and the requirements of users have led to the manufacture of smaller and lighter electronic devices. Accordingly, it is desirable that semiconductor devices used in such electronic devices be highly integrated. Thus, a design rule regarding components of semiconductor devices had decreased.

SUMMARY

Embodiments are directed to a semiconductor device including a substrate having a plurality of active regions defined by a device isolation region, a plurality of conductive patterns on the plurality of active regions, each of the conductive patterns having side walls, a conductive line that faces the side walls of the conductive patterns with an air spacer therebetween on the active regions, the conductive line extending in a first direction, and a first insulating film covering the side walls of the conductive patterns between the air spacer and the conductive pattern. A lower portion of the first insulating film that is near the substrate protrudes toward the air spacer.

A portion of the first insulating film that is near the substrate may have a greater width in a second direction that is perpendicular to the first direction than a remaining portion of the first insulating film.

The conductive pattern may contact a top surface and side wall of the active region.

The active region may have a corner portion that is recessed from the top surface of the active region between the top surface and side wall of the active region contacting the conductive pattern. The conductive pattern may contact the corner portion.

The first insulating film may have a multi-layer structure including a first insulating film layer contacting the conductive pattern, and a second insulating film layer that is spaced apart from the conductive pattern and is exposed in the air spacer.

The lower portion of the first insulating film that is near the substrate and protrudes toward the air spacer may be the first insulating film layer.

The first insulating film layer and the second insulating film layer may be formed of an identical material.

The semiconductor device may include a second insulating film that includes a first portion covering the conductive line between the air spacer and the conductive line and a second portion that extends from the first portion to contact the first insulating film, the second portion of the second insulating film having a top surface exposed in the air spacer. The conductive pattern may extend toward the substrate through the second portion of the second insulating film to contact the active region.

A portion of the conductive pattern extending toward the substrate through the second portion of the second insulating film may extend in a second direction that is perpendicular to the first direction under the second portion of the second insulating film.

A portion of the air spacer that is near the second portion of the second insulating film may have a lesser width with respect to the second direction that is perpendicular to the first direction than a remaining portion of the air spacer.

The semiconductor device may further include a third insulating film with a bottom surface that is disposed between the first portion of the second insulating film and the first insulating film and exposed in the air spacer.

Embodiments are also directed to a semiconductor device including a stack structure including a conductive line and an insulating capping line and extending in a first direction on a substrate, a contact plug having a side wall that faces the conductive line with an air spacer therebetween, and a first insulating film covering the side wall of the contact plug between the air spacer and the contact plug. A width of a lower portion of the first insulating film may increase in a second direction that is perpendicular to the first direction, so that the lower portion of the first insulating film protrudes toward the air spacer.

The semiconductor device may further include a second insulating film having a top surface that covers the conductive line and is exposed by the air spacer between the air spacer and the conductive line. An interval between the first insulating film and the second insulating film corresponding to a lower portion of the air spacer may decrease with respect to the second direction that is perpendicular to the first direction.

The semiconductor device may further include a third insulating film with a bottom surface that is disposed between the insulating capping line and the first insulating film and exposed in the air spacer.

The air spacer may extend from a level that is lower than a bottom surface of the conductive line to a level that is higher than a top surface of the conductive line.

Embodiments are also directed to a semiconductor device including a substrate having a plurality of active regions defined by a device isolation region, a conductive pattern, the conductive pattern having a side wall, a stack structure on the substrate, the stack structure being made up of a conductive line and an insulating capping line stacked on the conductive line, the stack structures having a side wall that faces the side wall of the conductive pattern, a first insulating film covering the side wall of the conductive pattern, a second insulating film covering the side wall of the stack structure, the second insulating film including a bottom portion that extends to contact the conductive pattern, and a third insulating film between an upper end of the insulating capping line and an upper end of the first insulating film. The first insulating film may include a protruding portion at a lower end thereof that protrudes toward the stack structure. The first insulating film, the second insulating film, and the third insulating film may define an air spacer between the conductive pattern and the stack structure.

The air spacer may extend from a level that is lower than a bottom surface of the conductive line to a level that is higher than a top surface of the conductive line.

The conductive pattern may extend into the substrate to contact one active region of the plurality of active regions. The active region may have a top surface, a side wall and corner portion that is recessed from the top surface of the active region between the top surface and side wall of the active region. The conductive pattern may contact the top surface, side wall and corner portion of the active region.

A portion of the conductive pattern may extend between a bottom surface of the second insulating film and a top surface of the active region.

A direct contact may extend into the substrate from the stack structure to contact an active region adjacent to the one active region contacted by the conductive pattern.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
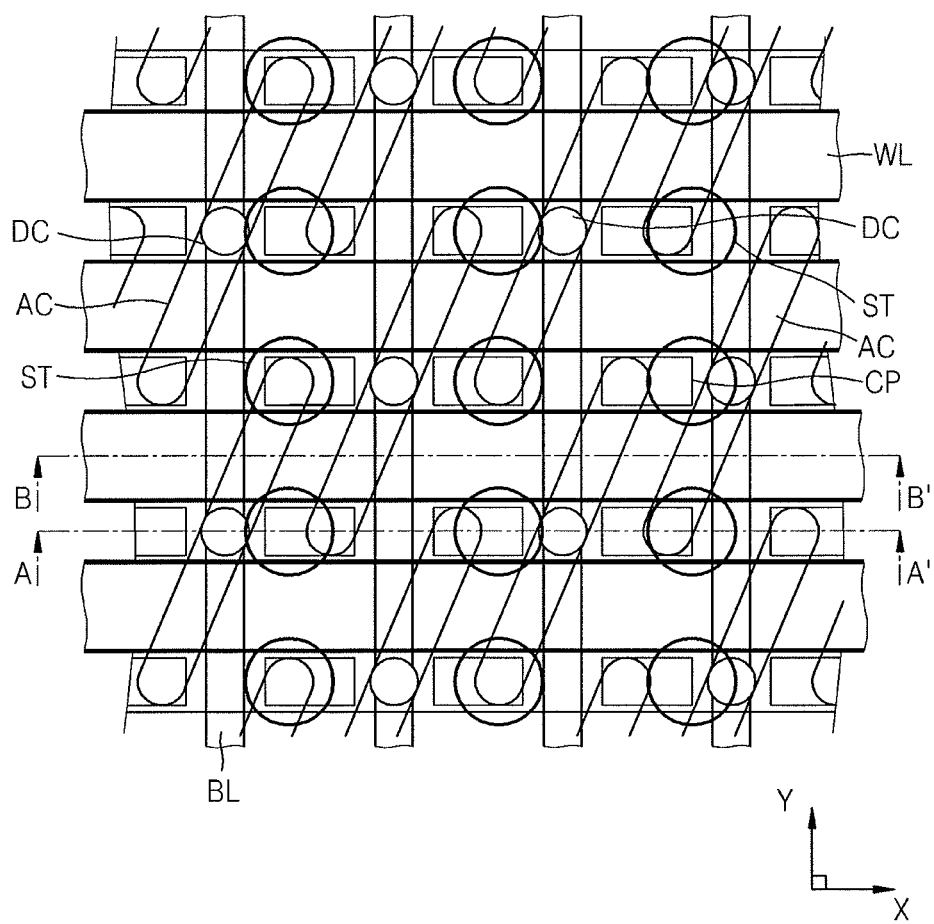
FIG. 1 illustrates a schematic view of a layout of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It is to be understood that when a layer or element is referred to as being "on" another layer or substrate, it can be directly on the other layer or substrate, or intervening layers may also be present. Further, it is to be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It is to be understood that when an element, such as a layer, a region, or a substrate, is referred to as being "on," or "connected to" another element, it may be directly on, or connected to the other element or intervening elements may be present. In contrast, when an element is referred to as being "directly on," or "directly connected to" another element or layer, there are no intervening elements or layers present. Other expressions, such as, "between" and "directly between", describing the relationship between the constituent elements, may be construed in the same manner.

The terms such as "first" and "second" are used herein merely to describe a variety of constituent elements, but the constituent elements are not limited by the terms. The terms are used only for the purpose of distinguishing one constituent element from another constituent element. For example, without departing from the right scope, a first constituent element may be referred to as a second constituent element, and vice versa.

The expression of singularity in the present specification includes the expression of plurality unless clearly specified otherwise in context. Also, the terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Unless defined otherwise, all terms used herein including technical or scientific terms have the same meanings as those generally understood by those skilled in the art to which the embodiments may pertain.

As used herein, the term "and/or" includes any and all combinations of one or more of the associated listed items.

FIG. 1 illustrates a schematic view of a layout of a semiconductor device 100 according to an embodiment. The layout of FIG. 1 may be applicable to, for example, a memory cell with a unit cell size of 6F2 that is included in a semiconductor memory device. Herein, F indicates a minimum lithographic feature size.

Referring to FIG. 1, the semiconductor device 100 includes a plurality of active regions AC. A plurality of word lines WL may extend in a first direction (X direction) across the active regions AC in parallel to each other. The word lines WL may be disposed at equivalent intervals. A plurality of bit lines BL may extend on the word lines WL in a second direction (Y direction), which is different from the first direction (X direction), in parallel to each other. The second direction (Y direction) may be, for example, perpendicular to the first direction (X direction).

The bit lines BL may be connected to the active regions AC through direct contacts DC.

For example, the bit lines BL may each have a pitch of 3F and may be disposed parallel to each other. For example, the word lines WL may each have a pitch of 2F and may be disposed parallel to each other.

A plurality of contact plugs CP may be arranged in a row in the first direction (X direction) and the second direction (Y direction) between adjacent two bit lines BL of the bit lines BL. In some embodiments, the contact plugs CP may be disposed at equivalent intervals in the second direction (Y direction). The contact plugs CP may constitute a buried contact for an electric connection of a storage electrode ST of a capacitor to the active region AC.

Figure 13:
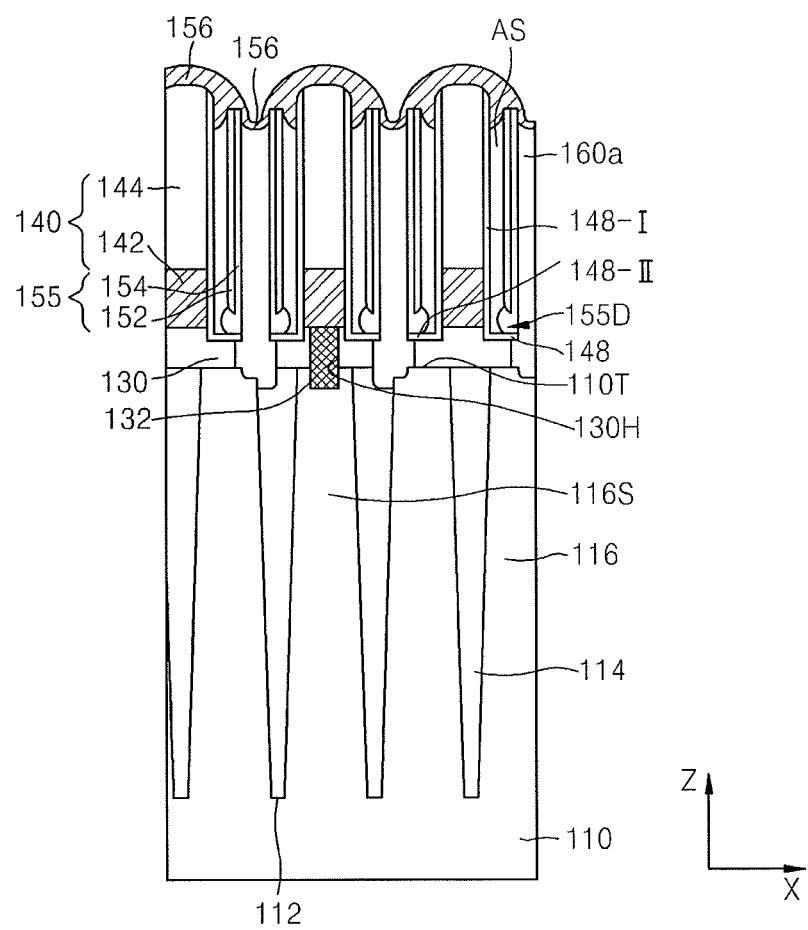
Figure 14:
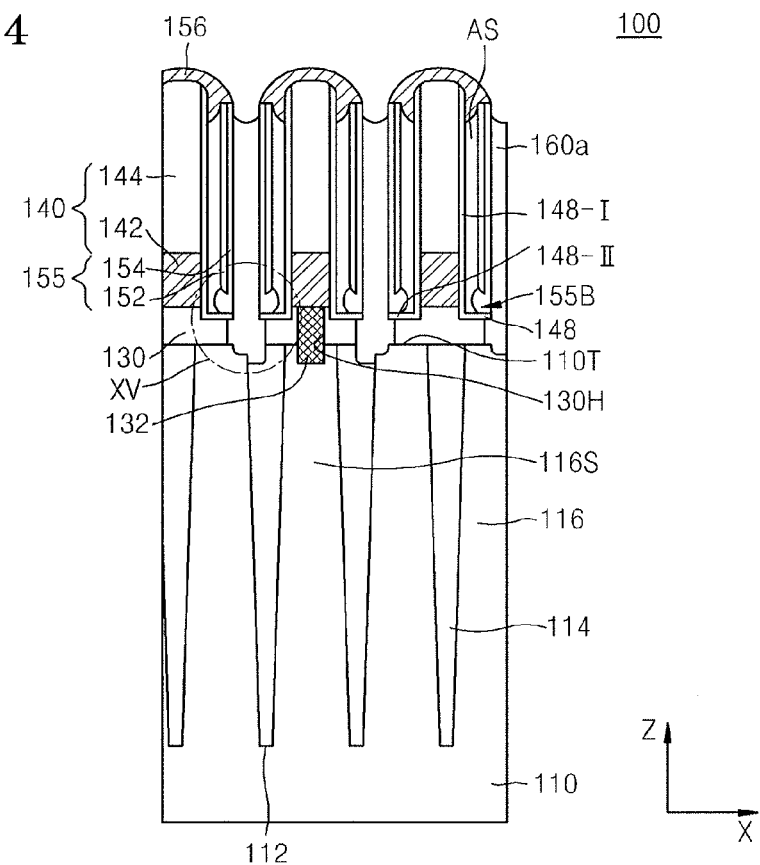

FIGS. 2A to 14 illustrate cross-sectional views depicting stages of a method of manufacturing a semiconductor device 100 of FIG. 14, according to an embodiment.

Figure 2B:
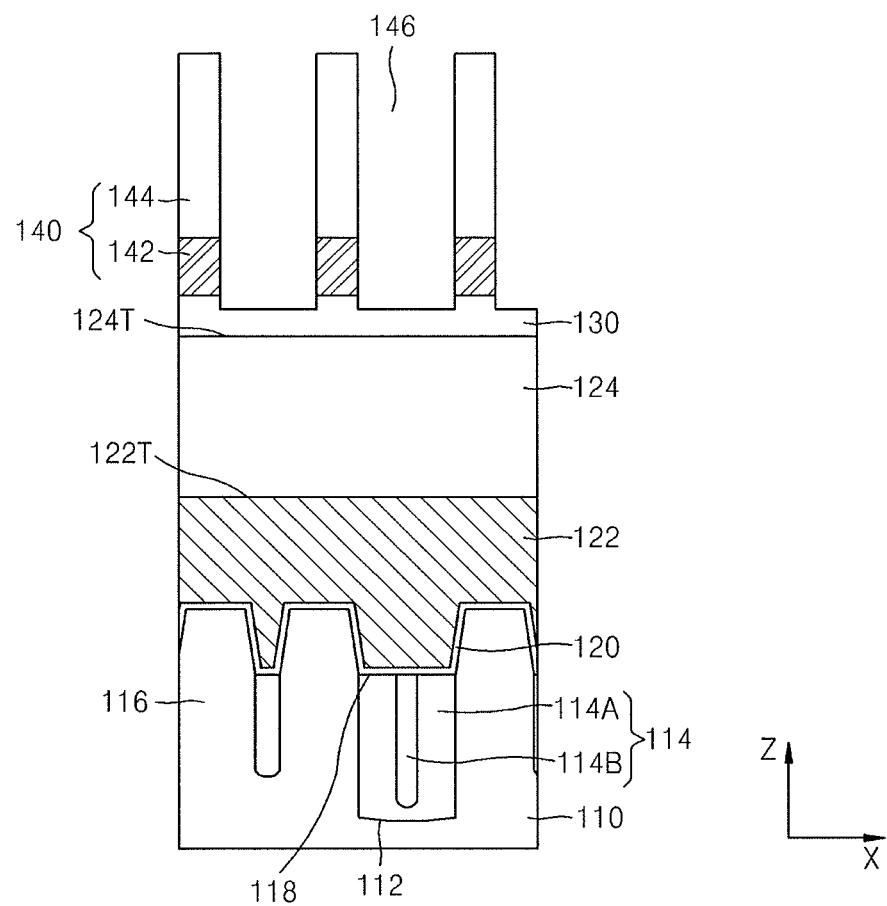
FIGS. 2A to 14 illustrate cross-sectional views depicting stages of a method of manufacturing a semiconductor device, according to an embodiment.

The semiconductor device 100 may have the layout illustrated in FIG. 1. FIGS. 2A, and 3 to 14 are cross-sectional views corresponding to line A-A' of FIG. 1. FIG. 2B is a cross-sectional view corresponding to line B-W of FIG. 1. Referring to FIGS. 1 and 2A to 14, like reference numerals denote like elements. Explanations of like elements will not be repeated.

Referring to FIGS. 2A and 2B, a device isolation trench 112 is formed in a substrate 110, and a device isolation region 114 is formed inside the device isolation trench 112. The device isolation region 114 may define a plurality of active regions 116 in the substrate 110. The active regions 116 may each have a relatively long island shape having a short axis and a long axis.

The substrate 110 may include, for example, crystalline, polycrystalline, or amorphous silicon (Si). The substrate 110 may include, for example, germanium (Ge) or a compound semiconductor, such as silicon germanium (SiGe), silicon carbide (SiC), gallium arsenide (GaAs), indium arsenide (InAs), or indium phosphide (InP). In some embodiments, the substrate 110 may have a silicon-on-insulator (SOI) structure or a buried oxide (BOX) layer. The substrate 110 may include a conductive region, for example, an impurity-doped well or an impurity-doped structure.

The device isolation region 114 may include a first device isolation film 114A and a second device isolation film 114B. The first device isolation film 114A and the second device isolation film 114B may be formed of different materials. For example, the first device isolation film 114A may be an oxide film, and the second device isolation film 114B may be a nitride film. In other implementations, the device isolation region 114 may include a single layer formed of an insulating film, or a multi-layer formed of a combination of at least three different insulating films.

A plurality of word line trenches 118 may be formed in the substrate 110. The word line trenches 118 may extend parallel to each other, and may each have a linear shape crossing a plurality of active regions 116.

As illustrated in FIG. 2B, to form the word line trenches 118 with a step at a lower surface, the device isolation region 114 and the substrate 110 may be etched by using different etching processes such that an etch depth of the device isolation region 114 is different from an etch depth of the substrate 110.

The resultant structure, including the word line trenches 118, may be washed, and then, a plurality of gate dielectric films 120 may be formed inside the word line trenches 118, and a plurality of word lines 122 and a plurality of buried insulating films 124 may be sequentially formed thereon.

In some embodiments, after the word lines 122 are formed, impurity ions may be implanted into the substrate 110 on both sides of the word line 122 to form source and drain regions (not shown) on top surfaces of the active regions 116. In other embodiments, the impurity ion implantation process for forming source and drain regions may be performed before the word lines 122 are formed.

A top surface 122T of each of the word lines 122 may be located at a lower level than a top surface 110T of the substrate 110. A lower surface of each of the word lines 122 may have an uneven structure, and a saddle FINFET may be formed in the active regions 116. The word lines 122 may be formed of, for example, at least one material selected from Ti, TiN, Ta, TaN, W, WN, TiSiN, and WSiN.

The gate dielectric film 120 may be formed of at least one selected from high-k dielectric films, which have a higher dielectric constant than silicon oxide film, silicon nitride film, silicon oxynitride film, oxide/nitride/oxide (ONO), or silicon oxide film. For example, the gate dielectric film 120 may have a dielectric constant of 10 to 25. The gate dielectric film 120 may be formed of, for example, at least one material selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric film 120 may be formed of $HfO_2$, $Al_2O_3$, $HfAlO_3$, $Ta_2O_3$, or $TiO_2$.

A top surface 124T of each of the buried insulating films 124 may be almost at the same level as the top surface 110T of the substrate 110. The buried insulating film 124 may include a silicon oxide film, a silicon nitride film, a silicon oxynitride film, or a combination thereof.

An interlayer-insulating film pattern 130 may be formed on the substrate 110. The interlayer-insulating film pattern 130 may be formed to have a thickness of about 200 to about 400 Å. The interlayer-insulating film pattern 130 may be formed of silicon oxide. In other implementations, the interlayer-insulating film pattern 130 may be formed of tetraethyl orthosilicate (TEOS), or borophosphosilicate glass (BPSG) and may be formed by a high density plasma (HDP) process.

The interlayer-insulating film pattern 130 may have a plurality of openings 130H exposing a plurality of source regions 116S of the active regions 116.

The openings 130H formed in the interlayer-insulating film pattern 130 may be filled with a conductive material to form a plurality of direct contacts 132 that are electrically connectable to the source regions 116S of the active regions 116.

The direct contacts 132 may be formed to protrude into the source regions 116S of the active regions 116. In some embodiments, a top surface of the source region 116S of the active region 116 to which the direct contacts 132 are connected may be at a lower level than a top surface of a portion of the active region 116 other than the source region 116S. The direct contacts 132 may extend to a level that is lower than a top surface of a portion of an active region 116 other than the source region 116S.

In some implementations, the interlayer-insulating film pattern 130 may further be formed of materials other than silicon oxide. The interlayer-insulating film pattern 130 may further be formed of, for example, polycrystalline silicon. Even when the interlayer-insulating film pattern 130 is formed of polycrystalline silicon, the polycrystalline silicon may be surrounded by the remaining part of the interlayer-insulating film 130 and thus, the interlayer-insulating film pattern 130 may as a whole act as an insulating film.

A plurality of bit line stack structures 140 may be formed extending parallel to each other on the interlayer-insulating film pattern 130 and the direct contacts 132. The bit line stack structures 140 may include a plurality of bit lines 142 and a plurality of insulating capping lines 144 covering top surfaces of the bit lines 142. The bit lines 142 may be electrically connected to the direct contacts 132.

The bit lines 142 may be formed of, for example, at least one material selected from an impurity-doped semiconductor, metal, a conductive metal nitride, and metal silicide. For example, the bit lines 142 may each have a stack structure formed by sequentially depositing doped polysilicon, tungsten nitride, and tungsten.

The insulating capping lines 144 may be formed of, for example, a silicon nitride film. A thickness of the insulating capping lines 144 may be greater than that of the bit lines 142. For example, a thickness of the insulating capping lines 144 in the Z-direction may be greater than that of the bit lines 142.

In some embodiments, the bit line stack structures 140 may be formed as follows: first, a conductive layer for forming a bit line is formed on the interlayer-insulating film pattern 130, and then, an insulating layer is formed to cover the conductive layer. A thickness of the insulating layer may be greater than a thickness of the conductive layer for forming a bit line. The insulating layer is patterned to form the insulating capping lines 144. Then, the conductive layer for forming a bit line is etched by using the insulating capping lines 144 as an etch mask to form the bit lines 142. When the conductive layer for forming a bit line is etched, a portion of the interlayer-insulating film pattern 130 may be etched by excess etching such that the top surface of the interlayer-insulating film pattern 130 may have a step.

The conductive layer for forming a bit line may be, for example, a multi-layer. The conductive layer for forming a bit line may have, for example, a multi-layer structure formed by sequentially depositing a first metal silicide film, a conductive barrier film, a second metal silicide film, and an electrode layer formed of metal or conductive metal nitride.

A space 146 may remain between adjacent bit line stack structures 140. The space 146 may have a linear shape.

Figure 3:
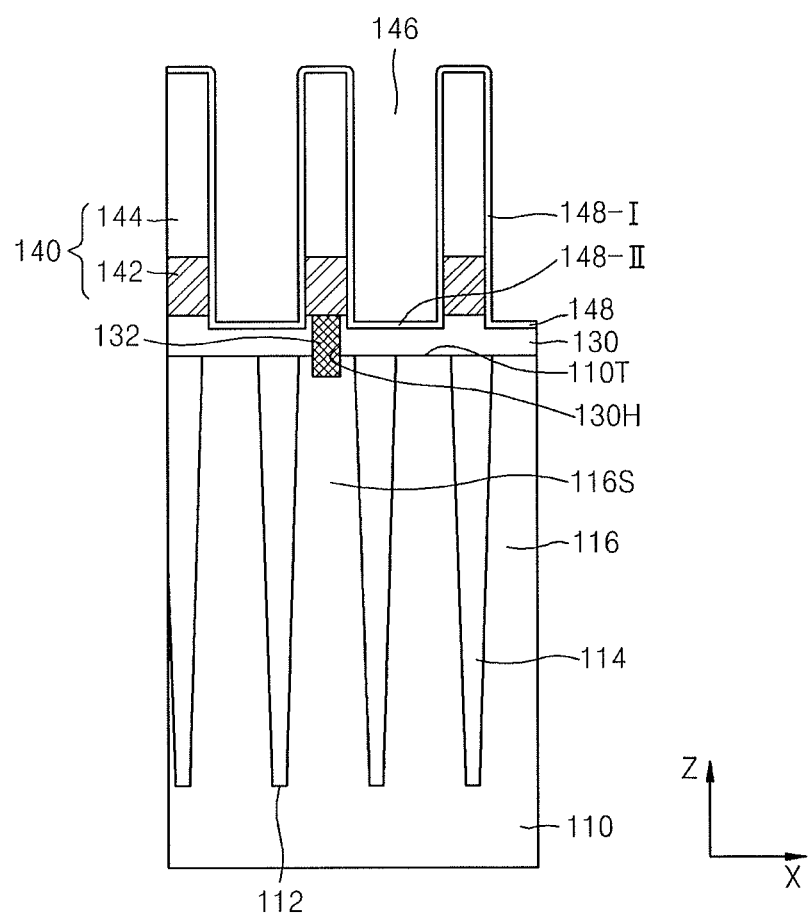

Referring to FIG. 3, a first insulating liner 148 may be formed to cover exposed top surfaces and side walls of the bit line stack structures 140 and an exposed surface of the interlayer-insulating film pattern 130. The first insulating liner 148 may be used as, for example, an etch stopper in a subsequent process. The first insulating liner 148 may be used as a protection film for protecting the bit line stack structures 140. The first insulating liner 148 may be formed of, for example, a silicon nitride film. The first insulating liner 148 may be formed to have a thickness of, for example, about 30 to about 80 Å.

The first insulating liner 148 may include a first portion 148-I covering the side wall of the bit line stack structure 140 and a second portion 148-II covering the exposed surface of the interlayer-insulating film pattern 130. Referring to the cross-sectional view of FIG. 3, the term "first portion 148-I" of the first insulating liner 148 refers to a portion of the first insulating liner 148 that extends in a third direction (Z direction) along the side wall of the bit line stack structure 140, and the term "second portion 148-II" of the first insulating liner 148 refers to a portion of the first insulating liner 148 that extends in the first direction (X direction) along a bottom of the space 146. The first portion 148-I and the second portion 148-II of the first insulating liner 148 as illustrated in the cross-section in FIG. 3 may extend together in a direction (Y direction of FIG. 1) that is perpendicular to the first and third directions (X and Z directions).

Figure 4:
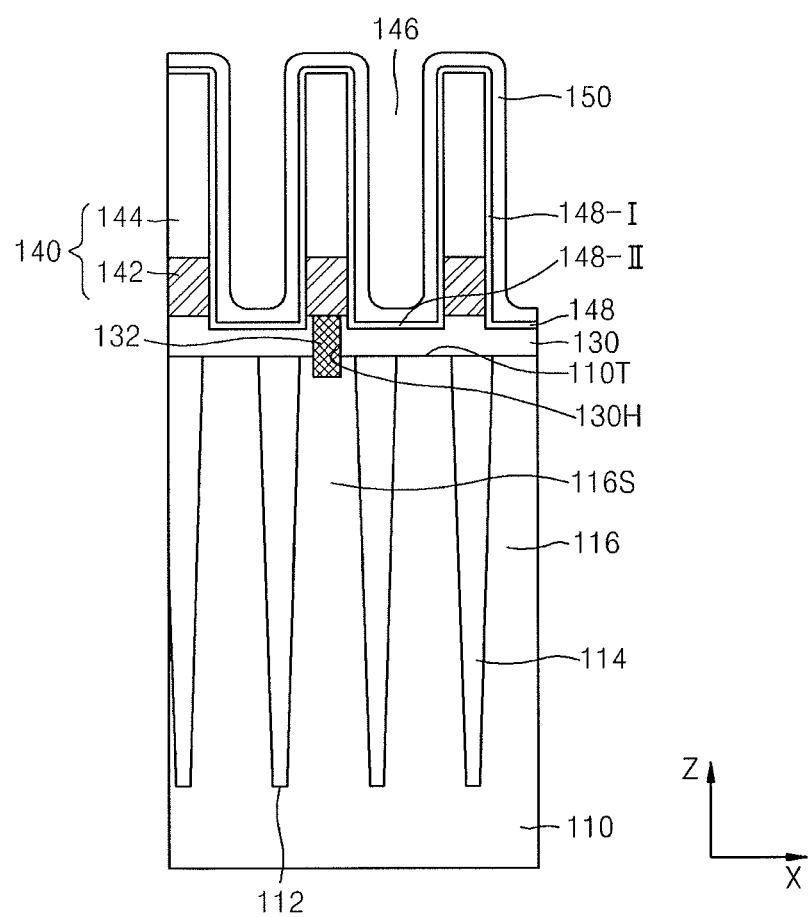

Referring to FIG. 4, a sacrificial layer 150 may be deposited on the resultant structure, including the first insulating liner 148. The sacrificial layer 150 may not completely fill the space 146 and may be formed to have a homogeneous thickness, covering the first insulating liner 148. The sacrificial layer 150 may be formed of, for example, silicon oxide, silicon germanium (SiGe), or a polymer. According to some implementations, the sacrificial layer 150 may be formed of, for example, a material that has an etch selectivity with respect to the first insulating liner 148. For example, the sacrificial layer 150 may be formed of an insulating material or a conductive material.

Figure 5:
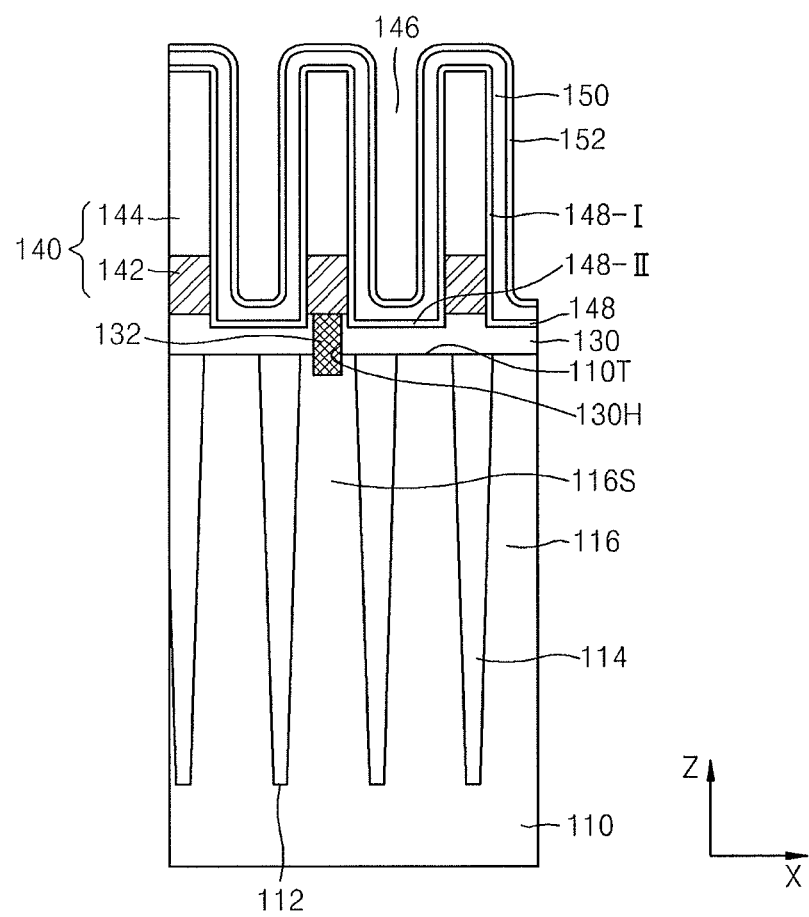

Referring to FIG. 5, a second insulating liner 152 may be deposited on the resultant structure including the sacrificial layer 150. The second insulating liner 152 may not completely fill the space 146 and may be formed to have a homogeneous thickness, covering the sacrificial layer 150. The second insulating liner 152 and the sacrificial layer 150 may be formed of different materials. The second insulating liner 152 may be formed of, for example, an oxide film, a nitride film, or a silicon oxynitride film. The second insulating liner 152 may be formed to have a thickness of, for example, about 20 to about 100 Å.

Figure 6:
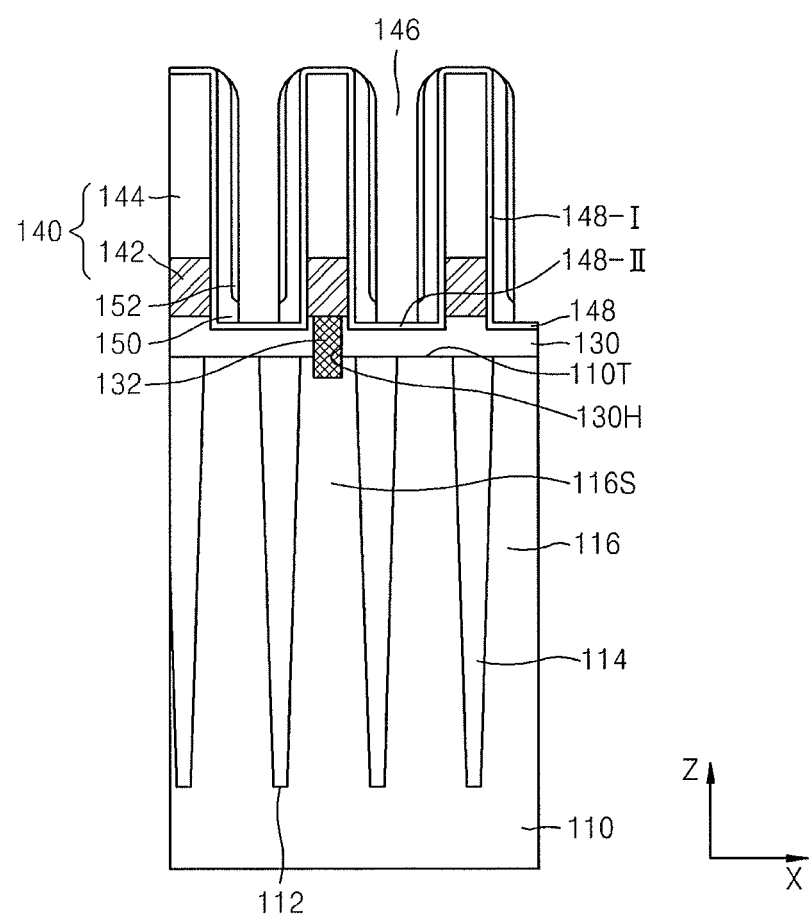

Referring to FIG. 6, the sacrificial layer 150 and the second insulating liner 152 may be etched back to form a spacer structure in which the sacrificial layer 150 and second insulating liner 152 cover the side wall of the bit line stack structure 140. A portion of the sacrificial layer 150 that is near the bottom of the space 146 may be exposed. Also, a portion of the sacrificial layer 150 that is near the top surface of the bit line stack structure 140 may be exposed. The second insulating liner 152 may cover the sacrificial layer 150 such that upper and lower portions of the sacrificial layer 150 are exposed.

Although in FIG. 6, the first insulating liner 148 is illustrated as remaining on the top surface of the bit line stack structure 140 and the bottom of the space 146, in other implementations, a portion of the first insulating liner 148 corresponding to the top surface of the insulating capping line 144 may also be etched back to expose the top surface of the insulating capping line 144. In other implementations, a portion of the first insulating liner 148 corresponding to the bottom surface of the space 146 may also be etched back.

Figure 7:
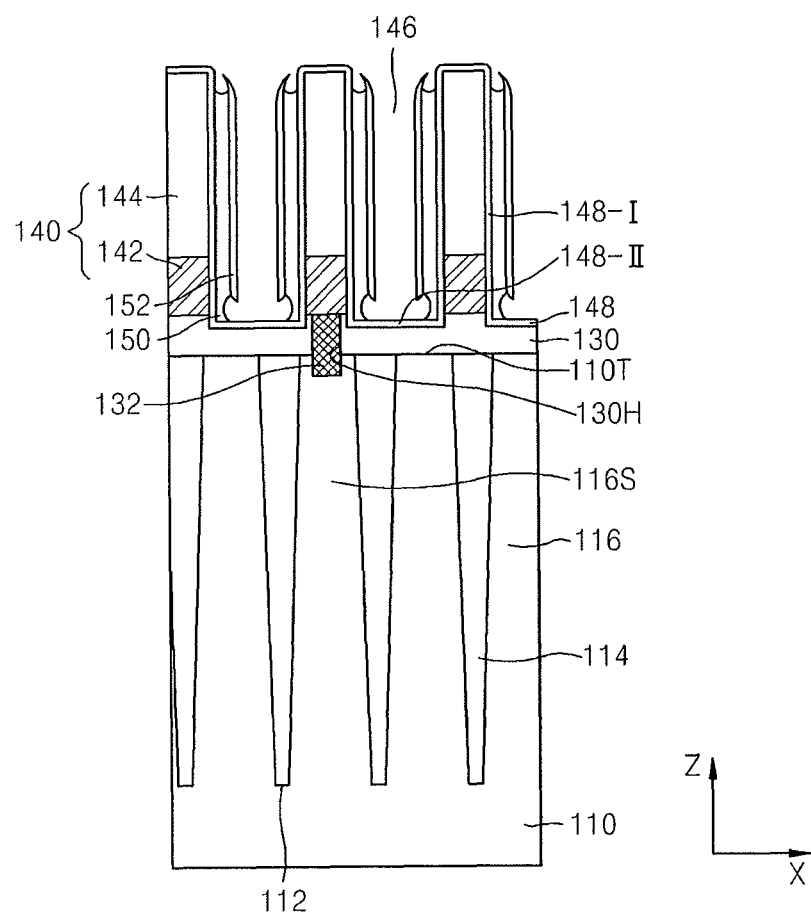

Referring to FIG. 7, a portion of the sacrificial layer 150 may be removed by performing an etching process with an etch selectivity with respect to the first insulating liner 148 and the second insulating liner 152. Accordingly, upper and lower portions of the sacrificial layer 150, exposed by the second insulating liner 152, may be partially removed.

For example, removing a portion of the sacrificial layer 150 may be performed by an isotropic etch process, such as wet etching.

The removal of a portion of the sacrificial layer 150 that is near the bottom surface of the space 146 may further expose only the second portion 148-II and not the first portion 148-I of the first insulating liner 148. When the lower portion of the sacrificial layer 150 is removed, the sacrificial layer 150 may remain on the first portion 148-I of the first insulating liner 148.

The removal of the exposed portion of the sacrificial layer 150 that is near an upper portion of the bit line stack structure 140 may expose the first portion 148-I of the first insulating liner 148. An upper portion of the sacrificial layer 150 may be removed such that the top surface of the remaining sacrificial layer 150 may be at a lower level than the top surface of the second insulating liner 152. Accordingly, when the portion of the sacrificial layer 150 that corresponds to an upper portion of the second insulating liner 152 is removed, a space is formed between the first insulating liner 148 and the second insulating liner 152.

When the portions of the sacrificial layer 150 are removed, the sacrificial layer 150 may overall have a homogeneous thickness in a direction from an upper portion to a lower portion of the sacrificial layer 150, with the thickness of the sacrificial layer decreasing close to the bottom of the space 146.

Figure 8:
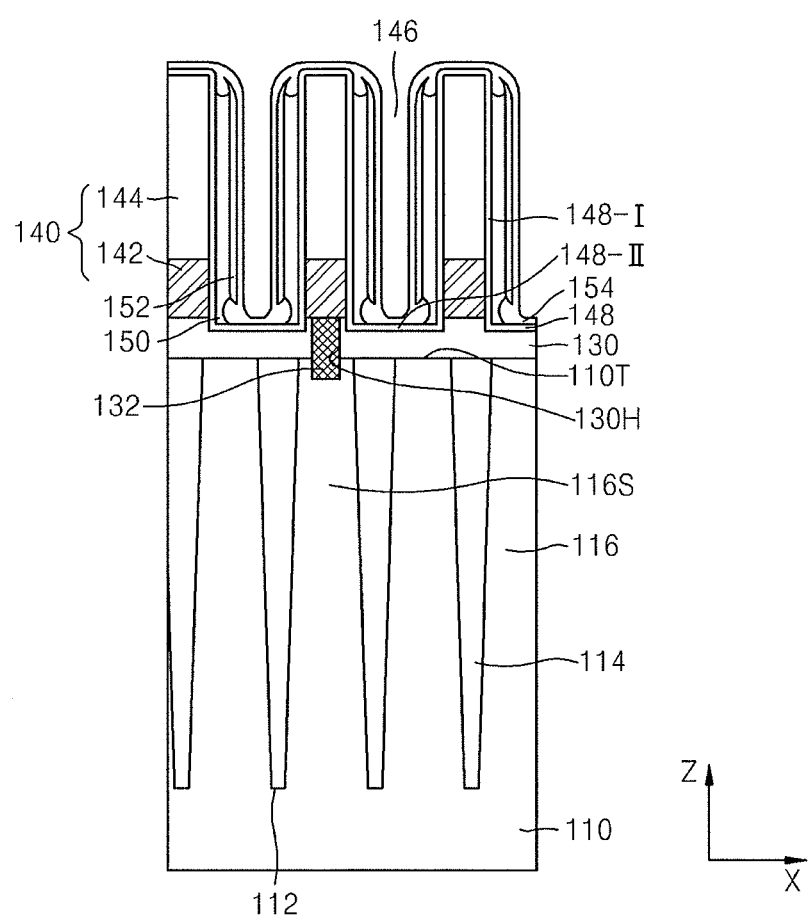

Referring to FIG. 8, a third insulating liner 154 may be formed on the resultant structure obtained by removing a portion of the sacrificial layer 150. The third insulating liner 154 may fill the space formed by removing a portion of the sacrificial layer 150, as illustrated in FIG. 7, and may cover the exposed first insulating liner 148 and the second insulating liner 152. Accordingly, portions of the third insulating liner 154 contacting the upper and lower portions of the sacrificial layer 150 may have a greater thickness than the other portion of the third insulating liner 154. The third insulating liner 154 may not completely fill the space 146. The sacrificial layer 150 may be fixed by the first insulating liner 148 and the second and third insulating liners 152 and 154.

The third insulating liner 154 and the sacrificial layer 150 may be formed of different materials. The third insulating liner 154 may be formed of, for example, an oxide film, a nitride film, or a silicon oxynitride film.

Figure 9:
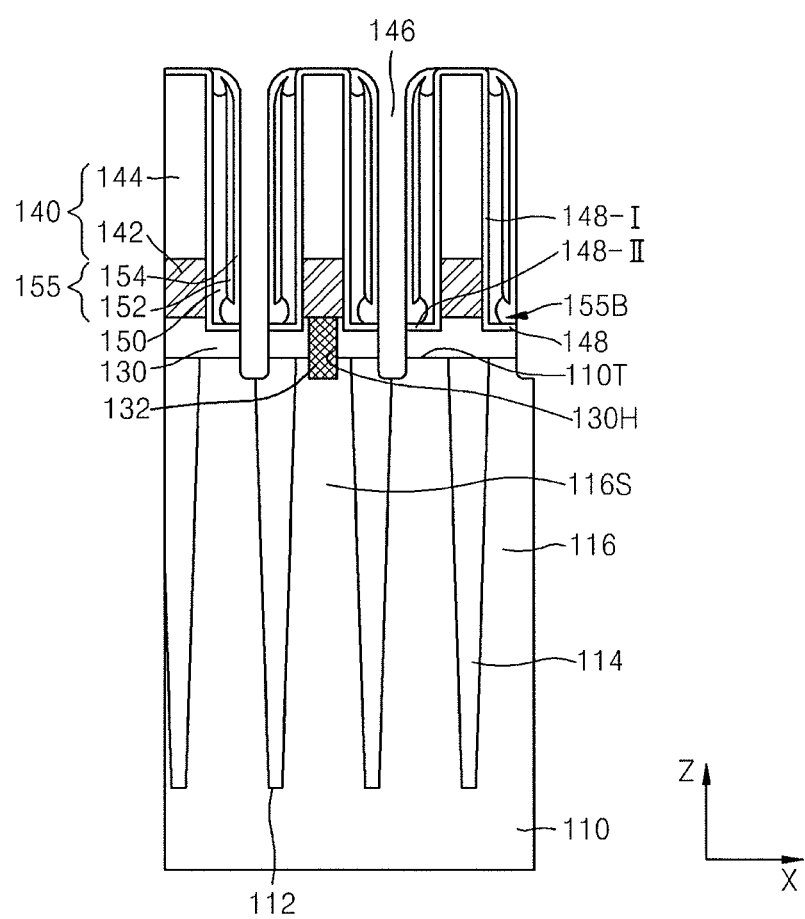

Referring to FIG. 9, a portion of the third insulating liner 154 that is exposed at the bottom of the space 146, the first insulating liner 148 and the interlayer-insulating film pattern 130 disposed thereunder may be removed to expose a portion of the active region 116 through the space 146. Accordingly, the space 146 may extend in the substrate 110 through the first insulating liner 148, in particular, through the second portion 148-II of the first insulating liner 148.

The removal of the portion of the third insulating liner 154, the first insulating liner 148 and the interlayer-insulating film pattern 130 disposed thereunder may be performed by forming a photoresist pattern (not shown) that covers the resultant structure, including the third insulating liner 154, and exposes only a portion of the space 146, and then etching. The photoresist pattern may have a plurality of holes that extend in the second direction (Y direction of FIG. 1), that expose a portion of the space 146, and that are separated from each other. Through the holes, an etching process may be performed on the portion of the third insulating liner 154 that is exposed at the bottom of the space 146, the first insulating liner 148 and the interlayer-insulating film pattern 130 disposed thereunder.

When the portion of the third insulating liner 154, the first insulating liner 148, and the interlayer-insulating film pattern 130 are removed, a portion of the device isolation region 114 may also be exposed. When the portion of the third insulating liner 154, the first insulating liner 148, and the interlayer-insulating film pattern 130 are removed, a portion of at least one of the active region 116 and the device isolation region 114 may also be removed to form a recessed shape. In this regard, the active region 116 may have a recessed corner portion.

When the portion of the third insulating liner 154 that is exposed at the bottom of the space 146 is removed, a portion of the third insulating liner 154 on a top surface of the bit line stack structure 140 may also be removed. Although in FIG. 9 the portion of the third insulating liner 154 on the top surface of the bit line stack structure 140 is shown as being completely removed to expose the first insulating liner 148, in other implementations, the portion of the third insulating liner 154 on the top surface of the bit line stack structure 140 may remain, only a portion of the third insulating liner 154 on the top surface of the bit line stack structure 140 may be removed so that the first insulating liner 148 is not exposed, or a portion of the first insulating liner 148 on the top surface of the bit line stack structure 140 may be removed together with the portion of the third insulating liner 154 on the top surface of the bit line stack structure 140.

When the first insulating liner 148 exposed at the bottom of the space 146 and the interlayer-insulating film pattern 130 disposed thereunder are removed, the sacrificial layer 150 may be protected from exposure due to the coverage of at least one of the third insulating liner 154 and the first insulating liner 148. A portion of the third insulating liner 154 contacting the upper portion of the sacrificial layer 150 may have a great thickness, so that even when a portion of the third insulating liner 154 is removed, the sacrificial layer 150 is not exposed. Accordingly, when a portion of at least one of the interlayer-insulating film pattern 130 and the device isolation region 114 is removed, the sacrificial layer 150 may remain without any portion thereof being removed.

Figure 10:
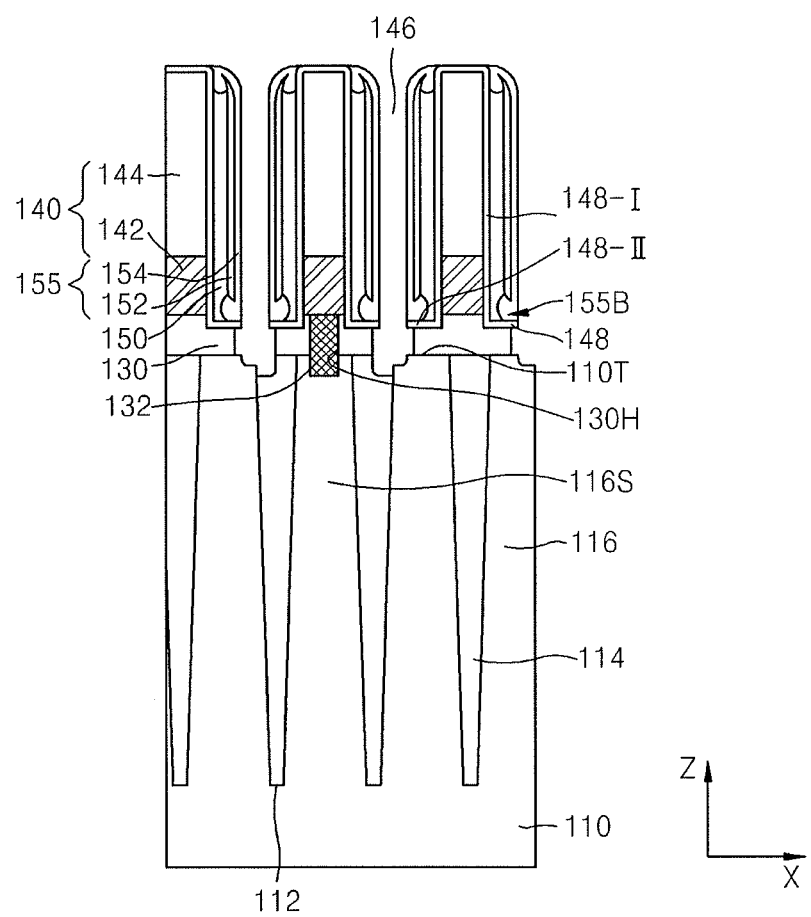

Referring to FIG. 10, an isotropic etching may be performed on the resultant structure through the space 146 to further remove the portion of the interlayer-insulating film pattern 130 that is exposed by the space 146. Accordingly, the space 146 may extend further below the second portion 148-II of the first insulating liner 152, and may further expose the top surface of the active region 116. In addition, due to the isotropic etching process, the portion of the device isolation region 114 that is exposed by the space 146 may also be removed. Accordingly, the space 146 may extend to expose the side wall of the active region 116.

The isotropic etching for extending the space 146 may be performed by using, for example, a wet etching method that enables an oxide to be removed. When the interlayer-insulating film pattern 130 further includes a material other than silicon oxide, due to the isotropic etching for extending the space 146, some silicon oxide of the interlayer-insulating film pattern 130 may be removed. According to materials constituting the interlayer-insulating film pattern 130, the portion of the interlayer-insulating film pattern 130 that is removed by the isotropic etching for extending the space 146, may be different from what is illustrated in FIG. 9. However, regardless of materials constituting the interlayer-insulating film pattern 130, the isotropic etching for extending the space 146 may cause the space 146 to extend further below the second portion 148-II of the first insulating liner 152 and further expose the top surface of the active region 116.

When the first device isolation film 114A and the second device isolation film 114B of the device isolation region 114 consist of different materials, as illustrated in FIG. 2B, the isotropic etching for extending the space 146 may remove only a portion of an oxide film. For example, when the first device isolation film 114A consists of an oxide film, and the second device isolation film 114B consists of a nitride film, the isotropic etching for extending the space 146 may remove only a portion of the first device isolation film 114A. That is, according to materials constituting the device isolation region 114, the portion of the device isolation region 114 that is removed by the isotropic etching for extending the space 146, may be different from the structure illustrated in FIG. 9. However, the isotropic etching for extending the space 146 may expose the side wall of the active region 116, extending the space 146, regardless of materials constituting the device isolation region 114.

While the isotropic etching for extending the space 146 is performed, the sacrificial layer 150 may be protected from exposure due to the relatively thick upper and lower portions of the third insulating liner 154 respectively contacting upper and lower portions of the sacrificial layer 150. For example, if the portions of the third insulating liner 154 respectively contacting upper and lower portions of the sacrificial layer 150 were to not have a great thickness, the isotropic etching for extending the space 146 could result in exposing at least one of the upper portion and the lower portion of the sacrificial layer 150. In such a case, when at least one of the upper portion and the lower portion of the sacrificial layer 150 is exposed, it may be difficult to form an air spacer by removing the sacrificial layer 150 in a subsequent process.

Figure 11:
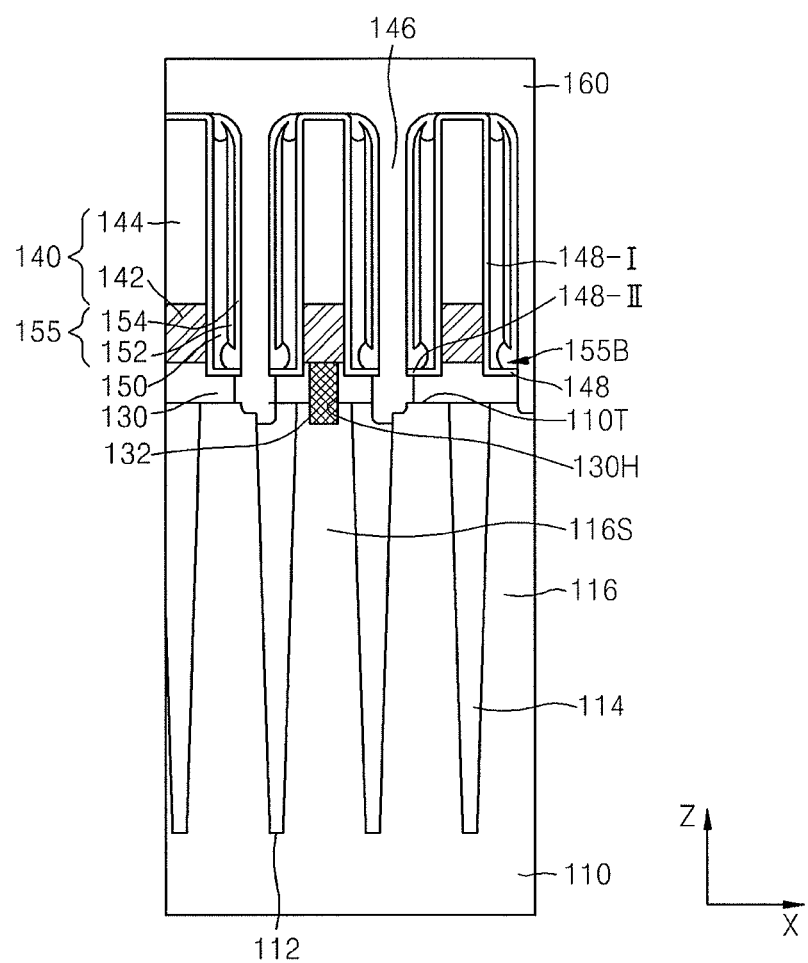

Referring to FIG. 11, a conductive material layer 160 filling the space 146 may be formed. The conductive material layer 160 may include a barrier film covering an inner wall of the space 146 and the bit line stack structure 140, and a conductive layer formed on the barrier film. The barrier film may be formed with a homogeneous thickness, not completely filling the space 146. The conductive layer may be formed to have such a thickness that the conductive layer fills the inside of the space 146. The barrier film may have a Ti/TiN stack structure. The conductive layer may be formed of a doped polysilicon, metal, metal silicide, metal nitride, or a combination thereof. For example, the conductive layer may include tungsten.

The conductive material layer 160 may completely fill a lower portion of the space 146, that is, a portion of the space 146 that is under the second portion 148-II of the first insulating liner 148. Accordingly, the conductive material layer 160 may be electrically connected to the active region 116, contacting a portion of the top surface of the active region 116, a portion of the side wall of the active region 116, and the corner portion of the active region 116.

Figure 12:
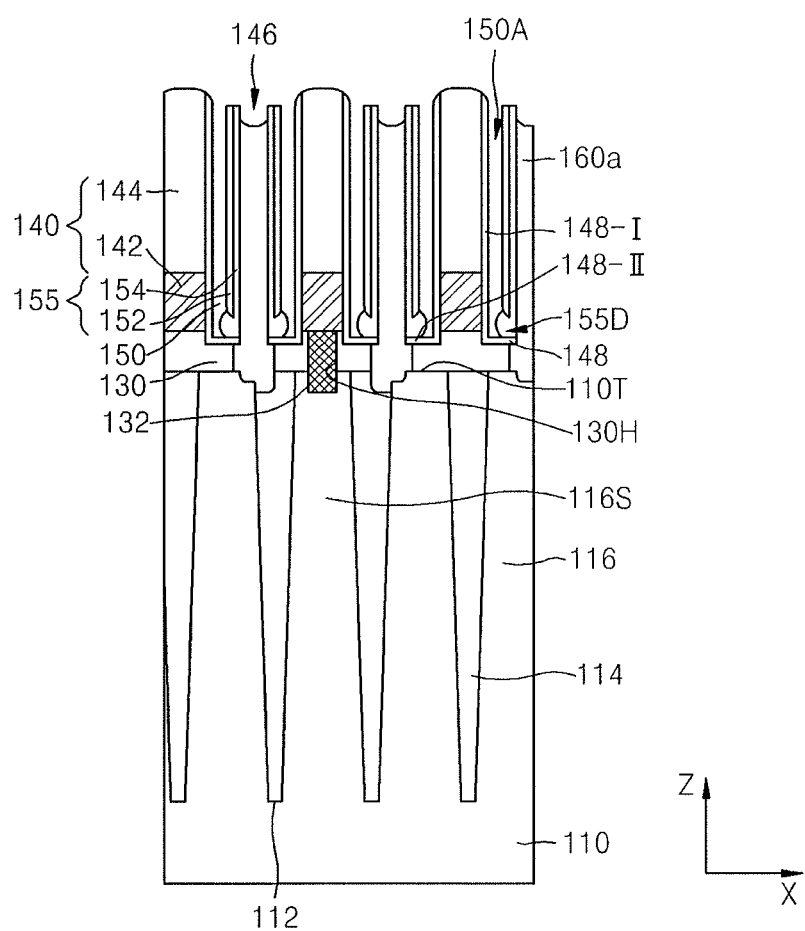

Referring to FIGS. 11 and 12, a portion of the conductive material layer 160 may be removed to form a conductive pattern 160a. The conductive pattern 160a may be formed inside the space 146 by etching-back and polishing the conductive layer until the barrier film is exposed, and removing the exposed barrier film.

In forming the conductive pattern 160a, the conductive layer may be etched-back or polished until the sacrificial layer 150 is exposed. In other embodiments, after the conductive pattern 160a is formed, a portion of the third insulating liner 154 covering the sacrificial layer 150 or portions of the second and third insulating liner 152 and 154 covering the sacrificial layer 150 may be removed to expose the sacrificial layer 150.

Thereafter, the exposed sacrificial layer 150 may be removed to form a gap 150A between the first insulating liner 148 and at least one of the second insulating liner 152 and the third insulating liner 154.

The conductive pattern 160a may form at least a portion of the contact plug CP illustrated in FIG. 1. The bit line 142 of the bit line stack structure 140 corresponding to the bit line BL illustrated in FIG. 1 may extend in the second direction (Y direction). The conductive pattern 160a may consist of a plurality of patterns that are spaced apart from each other along the second direction (Y direction). Accordingly, before the conductive material layer 160 illustrated in FIG. 11 is formed, an insulating material for separating the space 146 along the second direction (Y direction) may be applied. In other embodiments, after the conductive layer is etched back or polished, the conductive pattern 160a may be divided into a plurality of patterns spaced apart from each other along the second direction (Y direction) by etching.

The conductive pattern 160a may be electrically connected to the active region 116, contacting a portion of the top surface of the active region 116, a portion of the side wall of the active region 116, and a corner portion of the active region 116, under the second portion 148-II of the first insulating liner 148.

Referring to FIG. 12 and FIG. 13, an insulating material layer 156 may be formed on the resultant structure including the gap 150A. The insulating material layer 156 may define an upper space of the gap 150A. Accordingly, the insulating material layer 156 may cover the upper space of the gap 150A, sealing the gap 150A. By doing so, an air spacer AS surrounded by the first to third insulating liners 148, 152, and 154 and the insulating material layer 156 may be formed.

The air spacer AS may be disposed between the conductive pattern 160a and the bit line stack structure 140. The air spacer AS may be formed near the side wall of the bit line stack structure 140 without extending in the extension direction of the bit line stack structure 140.

The air spacer AS may extend from a level that is lower than a bottom surface of the bit line 142, which is a conductive line, to a level that is higher than a top surface of the bit line 142.

Referring to FIG. 14, a portion of the insulating material layer 156 may be removed by etching to expose the conductive pattern 160a. Thereafter, a capacitor (not shown) that is electrically connectable to the conductive pattern 160a may be formed to complete the manufacture of the semiconductor device 100.

Figure 15:
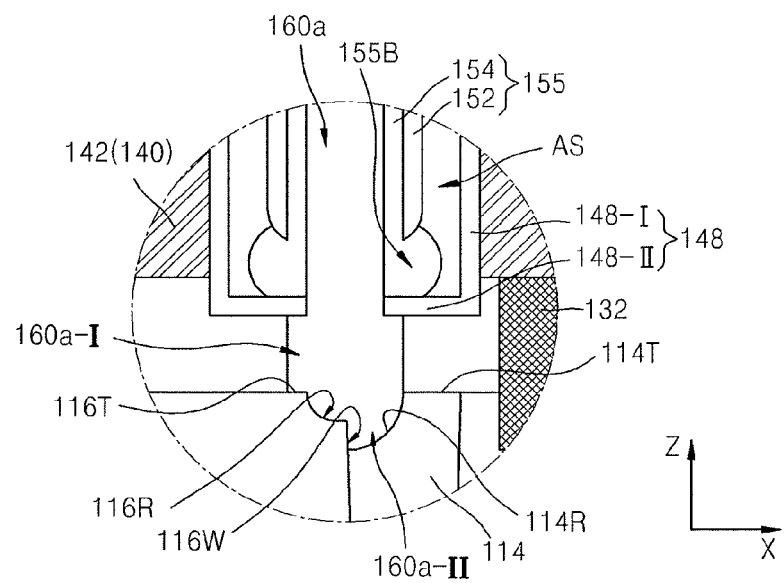
FIG. 15 illustrates an enlarged cross-sectional view of a portion of a semiconductor device according to an embodiment.

FIG. 15 illustrates an enlarged cross-sectional view of a portion of a semiconductor device according to an embodiment. In detail, FIG. 15 is an enlarged cross-sectional view of circle XV of FIG. 14.

Referring to FIGS. 14 and 15, the conductive pattern 160a may be formed on the active region 116, and may have side walls on both sides thereof along the first direction (X direction). The bit line stack structure 140, including the bit line 142, which is a conductive line, and the insulating capping line 144, may extend in the second direction (Y direction of FIG. 1) on the active region 116, and may face the side wall of the conductive pattern 160a with the air spacer AS therebetween.

The air spacer AS may extend from a level that is lower than a bottom surface of the bit line 142, which is a conductive line, to a level that is higher than a top surface of the bit line 142. Accordingly, the air spacer AS may extend along the entire region between the bit line 142 and the conductive pattern 160a.

A first insulating film 155 covering the side wall of the conductive pattern 160a may be formed between the air spacer AS and the conductive pattern 160a. The first insulating film 155 may have a multi-layer structure including the third insulating liner 154 contacting the conductive pattern 160a and the second insulating liner 152 that is separated from the conductive pattern 160a and is exposed in the air spacer AS. The third insulating liner 154 and the second insulating liner 152 may also be referred to as a first insulating film layer and a second insulating film layer, respectively. The second insulating liner 152 may be formed of, for example, an oxide film, a nitride film, or a silicon oxynitride film. The third insulating liner 154 may be formed of, for example, an oxide film, a nitride film, or a silicon oxynitride film. The third insulating liner 154 and the second insulating liner 152, that is, the first insulating film layer and the second insulating film layer, may be formed of an identical material.

The first insulating liner 148 may include the first portion 148-I covering the air spacer AS and the side wall of the bit line stack structure 140 including the bit line 142, which is a conductive line, and the second portion 148-II that extends from the first portion 148-I to contact the first insulating film 155. The second portion 148-II has a top surface exposed to the air spacer AS. The first insulating liner 148 may also be referred to as a second insulating film.

A lower portion of the first insulating film 155, which is near the substrate 110, may have a protrusion 155B protruding toward the air spacer AS. Accordingly, a width of the lower portion of the first insulating film 155 that is near the substrate 110 may increase in the first direction (X direction). A width of a portion of the air spacer AS that is near the second portion 148-II of the first insulating liner 148 may decrease in the first direction (X direction). That is, an interval between the first insulating film 155 and the first insulating liner 148 with respect to the first direction (X direction) may decrease in the lower portion of the air spacer AS.

The protrusion 155b of the first insulating film 155 may be formed when the third insulating liner 154 is formed, and may be a portion of the third insulating liner 154, that is, the first insulating film layer.

The conductive pattern 160a may extend toward the substrate 110 through the second portion 148-II of the first insulating liner 148 to contact the active region 116. The conductive pattern 160a may contact a top surface 116T and a side wall 116W of the active region 116. The active region 116 may have a corner portion 116R that is recessed from the top surface 116T between the top surface 116T and the side wall 116W of the active region 116 contacting the conductive pattern 160a. The conductive pattern 160a may contact the top surface 116T, the side wall 116W, and the corner portion 116R of the active region 116.

The conductive pattern 160a extending toward the substrate 110 through the second portion 148-II of the first insulating liner 148 may include a first extension portion 160a-I extending in the first direction (X direction) toward under the second portion 148-II and a second extension portion 160a-II extending along the side wall 116W of the active region 116.

The device isolation region 114 may have a corner portion 114R that is recessed from the top surface 114T of the device isolation region 114. The corner portion 114R of the device isolation region 114 may near the corner portion 116R of the active region 116. The lowermost portion of the corner portion 114R of the device isolation region 114 may have a lower level than the lowermost portion of the corner portion 116R of the active region 116.

The first extension portion 160a-I of the conductive pattern 160a may be a portion of the conductive pattern 160a filling the removed portion of the interlayer-insulating film pattern 130 illustrated in FIG. 10, and the second extension portion 160a-II of the conductive pattern 160a may be a portion of the conductive pattern 160a filling the removed portions of the active region 116 and the device isolation region 114. Due to the first extension portion 160a-I and the second extension portion 160a-II of the conductive pattern 160a, a contact area between the conductive pattern 160a and the active region 116 may increase. Accordingly, a contact resistance between the conductive pattern 160a and the active region 116 may be reduced.

The insulating material layer 156 may have a bottom surface that is disposed between the insulating capping line 144 and the first insulating film 155, or between the first portion 148-I of the first insulating liner 148 and the first insulating film 155 to be exposed by the air spacer AS. The insulating material layer 156 may also be referred to as a third insulating film.

Accordingly, the air spacer AS may be surrounded by the first insulating film 155, the second insulating film 148, and the third insulating film 156. Also, a space, that is, the air spacer AS that is to be filled with air, may exist between the bit line 142 and the conductive pattern 160a. Accordingly, due to the low dielectric property of the air spacer AS, a capacitance between the bit line 142 and the conductive pattern 160a may be minimized.

Figure 16:
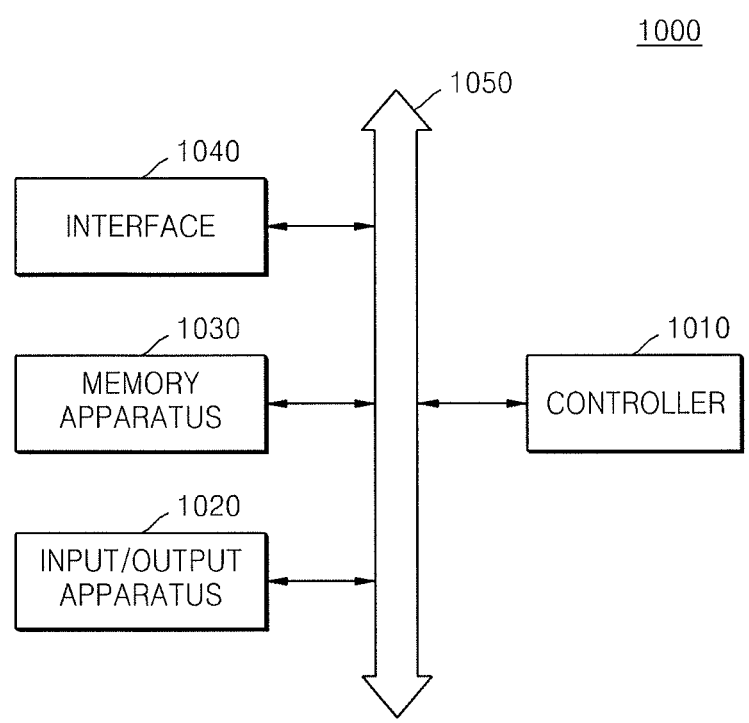
FIG. 16 illustrates a conceptual diagram showing a system including a semiconductor device according to an embodiment.

FIG. 16 illustrates a conceptual diagram showing a system 1000 including a semiconductor device according to an embodiment.

Referring to FIG. 16, the system 1000 may include a controller 1010, an input/output apparatus 1020, a memory apparatus 1030, and an interface 1040. The system 1000 may be a mobile system or a system that transmits or receives information. In some embodiments, the mobile system may be a personal digital assistant (PDA), a portable computer, a web tablet, a wireless phone, a mobile phone, a digital music player, or a memory card. The controller 1010 may control execution programs in the system 1000, and may include a microprocessor, a digital signal processor, a microcontroller, or the like. The input/output apparatus 1020 may be used to input or output data stored in the system 1000. The system 1000 may be connected to an external apparatus, for example, a personal computer or a network via the input/output apparatus 1020, and may exchange data with the external apparatus. The input/output apparatus 1020 may be, for example, a keypad, a keyboard, or a display.

The memory apparatus 1030 may store code and/or data for operation of the controller 1010, or may store data processed by the controller 1010. The memory apparatus 1030 may include a semiconductor device including a fin-type electric field effect transistor according to an embodiment. For example, the memory apparatus 1030 may include the semiconductor device 100 illustrated in FIGS. 1 to 14.

The interface 1040 may be a data transmission pathway between the system 1000 and other external apparatuses. The controller 1010, the input/output apparatus 1020, the memory apparatus 1030, and the interface 1040 may communicate with each other through a bus 1050. The system 1000 may be a mobile phone, an MP3 player, a navigation device, a portable multimedia player, a portable multimedia play (PMP), a solid state disk (SSD), or a household appliance.

By way of summation and review, regarding high-scaled semiconductor devices, as a distance between a plurality of interconnection lines and a plurality of contact plugs disposed between the interconnection lines decreases, the load capacitance of adjacent conductive patterns may increase, thereby adversely affecting an operation speed or refresh characteristics. In addition, a contact resistance between a contact plug and an active region may be increased or contact defects may be created. Also, during an anisotropic etching process for reducing contact resistance, a sacrificial layer for forming an air spacer may be exposed so that a air spacer may not be appropriately formed.

Embodiments provide a semiconductor device with a unit cell size that is decreased due to high integration, and having a structure for minimizing a load capacitance of a plurality of conductive patterns. According to embodiments, a portion of the active region contacting the contact plug may be extended to reduce a contact resistance between the contact plug and the active region. In addition, an insulating film may be formed to have a protrusion protruding toward the air spacer at the bottom of the air spacer. Accordingly, during anisotropic etching for extending the portion of the active region contacting the contact plug, a sacrificial layer filling a space that is to be formed into the air spacer is protected from exposure. Thus, the air spacer may be stably formed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A semiconductor device, comprising:
   a substrate having a plurality of active regions defined by a device isolation region;
   a plurality of conductive patterns on the plurality of active regions, each of the conductive patterns having side walls;
   a conductive line that faces the side walls of the conductive patterns with an air spacer therebetween on the active regions, the conductive line extending in a first direction; and
   a first insulating film covering the side walls of the conductive patterns between the air spacer and the conductive pattern,
   wherein a lower portion of the first insulating film that is near the substrate protrudes toward the air spacer, and
   wherein a portion of the air spacer that is adjacent to the lower portion of the first insulating film has a lesser width in a second direction that is perpendicular to the first direction than a remaining portion of the air spacer.

2. The semiconductor device as claimed in claim 1, wherein the lower portion of the first insulating film that is near the substrate has a greater width in a second direction that is perpendicular to the first direction than a remaining portion of the first insulating film.

3. The semiconductor device as claimed in claim 1, wherein
the conductive pattern contacts a top surface and side wall of the active region.

4. The semiconductor device as claimed in claim 3, wherein:
the active region has a corner portion that is recessed from the top surface of the active region between the top surface and side wall of the active region contacting the conductive pattern, and
the conductive pattern contacts the corner portion.

5. The semiconductor device as claimed in claim 1, wherein
the first insulating film has a multi-layer structure including a first insulating film layer contacting the conductive pattern and a second insulating film layer that is spaced apart from the conductive pattern and is exposed in the air spacer.

6. The semiconductor device as claimed in claim 5, wherein the lower portion of the first insulating film that is near the substrate and protrudes toward the air spacer is the first insulating film layer.

7. The semiconductor device as claimed in claim 5, wherein
the first insulating film layer and the second insulating film layer are formed of an identical material.

8. The semiconductor device as claimed in claim 1, further comprising
a second insulating film that includes a first portion covering the conductive line between the air spacer and the conductive line and a second portion that extends from the first portion to contact the first insulating film, the second portion of the second insulating film having a top surface exposed in the air spacer,
wherein the conductive pattern extends toward the substrate through the second portion of the second insulating film to contact the active region.

9. The semiconductor device as claimed in claim 8, wherein
a portion of the conductive pattern extending toward the substrate through the second portion of the second insulating film extends in a second direction that is perpendicular to the first direction under the second portion of the second insulating film.

10. The semiconductor device as claimed in claim 8, wherein
a portion of the air spacer that is near the second portion of the second insulating film has a lesser width with respect to the second direction that is perpendicular to the first direction than a remaining portion of the air spacer.

11. The semiconductor device as claimed in claim 8, further comprising
a third insulating film with a bottom surface that is disposed between the first portion of the second insulating film and the first insulating film and exposed in the air spacer.

12. A semiconductor device, comprising:
a stack structure including a conductive line and an insulating capping line and extending in a first direction on a substrate;
a contact plug having a side wall that faces the conductive line with an air spacer therebetween; and
a first insulating film covering the side wall of the contact plug between the air spacer and the contact plug,
wherein a width of a lower portion of the first insulating film increases in a second direction that is perpendicular to the first direction, so that the lower portion of the first insulating film protrudes toward the air spacer, and
wherein a portion of the air spacer that is adjacent to the lower portion of the first insulating film has a lesser width in the second direction than a remaining portion of the air spacer.

13. The semiconductor device as claimed in claim 12, further comprising:
a second insulating film having a top surface that covers the conductive line and is exposed by the air spacer between the air spacer and the conductive line.

14. The semiconductor device as claimed in claim 12, further comprising
a third insulating film with a bottom surface that is disposed between the insulating capping line and the first insulating film and exposed in the air spacer.

15. The semiconductor device as claimed in claim 12, wherein
the air spacer extends from a level that is lower than a bottom surface of the conductive line to a level that is higher than a top surface of the conductive line.

16. A semiconductor device, comprising:
a substrate having a plurality of active regions defined by a device isolation region;
a conductive pattern, the conductive pattern having a side wall;
a stack structure on the substrate, the stack structure including a conductive line and an insulating capping line stacked on the conductive line, the stack structures having a side wall that faces the side wall of the conductive pattern;
a first insulating film covering the side wall of the conductive pattern;
a second insulating film covering the side wall of the stack structure, the second insulating film including a bottom portion that extends to contact the conductive pattern; and
a third insulating film between an upper end of the insulating capping line and an upper end of the first insulating film,
wherein the first insulating film includes a protruding portion at a lower end thereof that protrudes toward the stack structure, and
the first insulating film, the second insulating film, and the third insulating film define an air spacer between the conductive pattern and the stack structure.

17. The semiconductor device as claimed in claim 16, wherein
the air spacer extends from a level that is lower than a bottom surface of the conductive line to a level that is higher than a top surface of the conductive line.

18. The semiconductor device as claimed in claim 16, wherein
the conductive pattern extends into the substrate to contact one active region of the plurality of active regions,
the active region has a top surface, a side wall and corner portion that is recessed from the top surface of the active region between the top surface and side wall of the active region, and
the conductive pattern contacts the top surface, side wall and corner portion of the active region.

19. The semiconductor device as claimed in claim 18, wherein a portion of the conductive pattern extends between a bottom surface of the second insulating film and a top surface of the active region.

20. The semiconductor device as claimed in claim 18, wherein a direct contact extends into the substrate from the stack structure to contact an active region adjacent to the one active region contacted by the conductive pattern.

* * * * *